United States Patent [19]

Maschek et al.

[11] Patent Number: 4,794,318

[45] Date of Patent: Dec. 27, 1988

[54] CURRENT TRANSDUCER ARRANGEMENT FOR OUTDOOR HIGH-VOLTAGE INSTALLATIONS

[75] Inventors: Martin Maschek, Würenlos; Georg Mastner, Niederrohrdorf, both of Switzerland

[73] Assignee: BBC Brown Boveri AG, Baden, Switzerland

[21] Appl. No.: 101,019

[22] Filed: Sep. 25, 1987

[30] Foreign Application Priority Data

Sep. 29, 1986 [CH] Switzerland .................. 3896/86

[51] Int. Cl.$^4$ ............................................ G01R 15/07
[52] U.S. Cl. .................... 323/358; 361/389; 361/391
[58] Field of Search ............... 323/355, 357, 358; 363/141, 144; 307/147–152; 324/126, 127; 361/381–384, 386, 388, 389, 391

[56] References Cited

U.S. PATENT DOCUMENTS

| | | | |
|---|---|---|---|
| 3,411,069 | 11/1968 | Kubler et al. | 323/358 |
| 3,453,544 | 7/1969 | Schweitzer, Jr. | 324/127 |
| 3,949,290 | 4/1976 | Ochiai et al. | 323/358 |
| 4,295,094 | 10/1981 | Wilreker et al. | 324/126 X |

FOREIGN PATENT DOCUMENTS

| | | |
|---|---|---|
| 154171 | 9/1985 | European Pat. Off. |
| 2005037 | 4/1979 | United Kingdom |
| 2017320 | 10/1979 | United Kingdom |

OTHER PUBLICATIONS

Braun et al., "Optoelectronic Electricity Meter for High-Voltage Lines", IEEE Trans. on Instr. and Meas., vol. 17–22, No. 4, Dec. 1973, pp. 394–399.

Jahn et al., "Doppeltgeschirmter Aufbau einer Messwertubertragungseinrichtung durch Modifizierung des EGS-Systems", Elektrie, vol. 39, No. 3, 1985, pp. 104–106.

*Primary Examiner*—Peter S. Wong
*Attorney, Agent, or Firm*—Burns, Doane, Swecker & Mathis

[57] ABSTRACT

To increase the availability of current transducers for outdoor high-voltage installations, an electronic signal processing device for the measurement signal of the current transducer is arranged above the current transducer as a block which can be removed from above within a transducer head casing which is painted on the outside. The electronic signal processing device is attached to a coverplate, which is aligned parallel to a primary conductor of a magnetic shield casing, which is surrounded by an electrical shield casing. The signal processing device consists of low-power electronics below and power electronics above the coverplate; it converts analog signals of the current transducer into digitized and encoded signals for serial transmission by means of a fibre-optical line. The power electronics are in good thermally conducting contract with the coverplate of the electrical shield casing via a metal plate. Lower and upper ventilation slots are provided at the transducer head casing. To keep any temperature increase due to solar irradiation low, radiation reflectors of polished and degreased aluminium are located at a distance of 3 cm between transducer head casing and electrical shield casing.

7 Claims, 1 Drawing Sheet

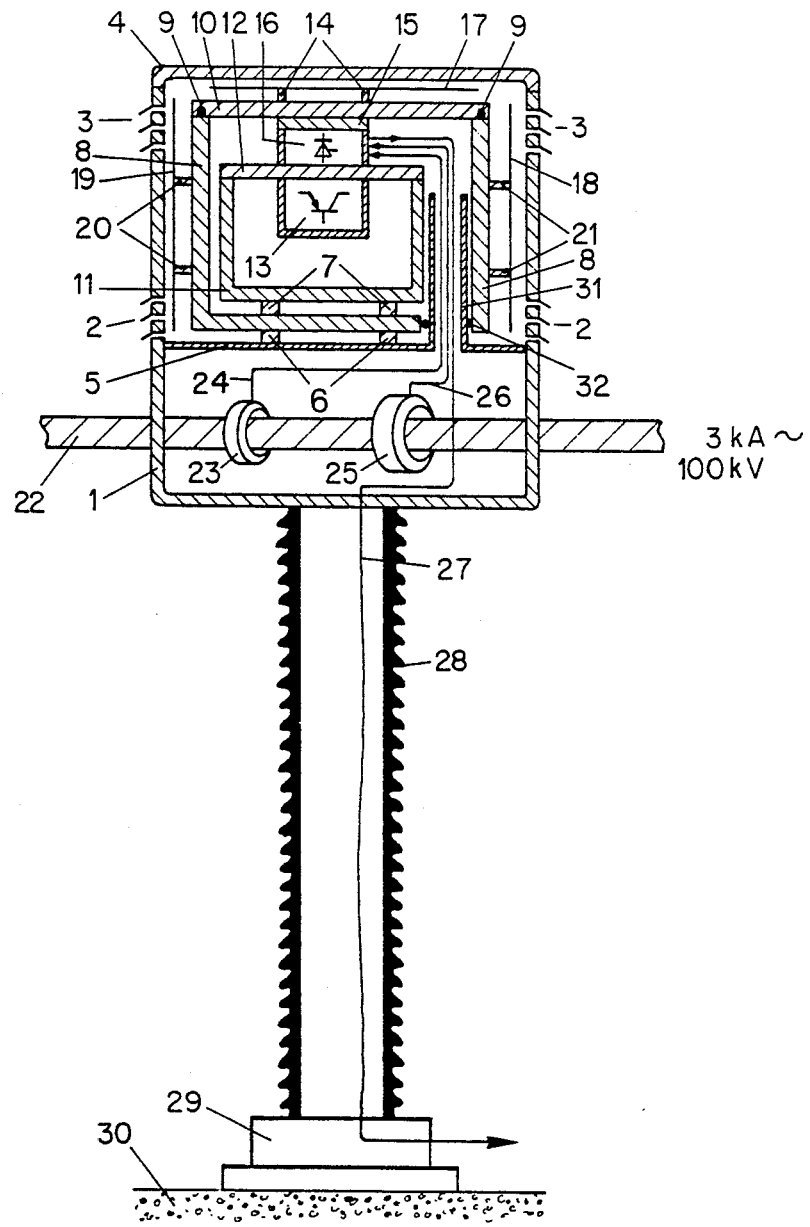

CURRENT TRANSDUCER ARRANGEMENT FOR OUTDOOR HIGH-VOLTAGE INSTALLATIONS

TECHNICAL FIELD

The invention is based on a current transducer arrangement for outdoor high-voltage installations.

PRIOR ART

The present invention relates current transducer arrangements for outdoor high-voltage installations such as is known from the report "Electronic Current Transducer for EHV Circuits", EL-1611, Research Project 560-1, pages 1-2, 1-3 and FIG. 5-3, Final Report, November 1980, Westinghouse Electric Corporation, Forbes Road, Trafford, Pa. 15085, USA. In this report, the electronic evaluating device for the measurement signal of the current transducer is placed underneath the current transducer and supported by a high-voltage insulator. In the evaluating device, the secondary current signal of at least one transformer-like current transducer is scaled, digitized and encoded. The digitized measurement values are transferred to earth potential by an optical fibre inside the high-voltage insulator and then into a control room where they are evluated. To supply the electronic evaluating device with power, an auxiliary transformer is used which derives the supply energy from the line current.

The disadvantageous factor in this is that the electronics are not easily accessible in the immediate vicinity of the high-voltage line in case of a repair which can last up to 8 h and can be expected at intervals of 3 a–6 a.

Representation of the invention

The present invention achieves the object of specifying a current transducer arrangement for outdoor high-voltage installations which exhibits greater availability and thus reduced dropout.

An advantage of the invention consists in the fact that a more rapid repair of the electronic current transducer is possible without the latter having to be calibrated again after the repair. The measurement value processing electronics as such are adjusted and calibrated so that no calibration of the overall electronic transducer (current transducer, electronics, measurement value transmission, evaluation) is necessary after the defective electronics have been replaced by new electronics. It is here of advantage if the shunt or load of the current transducer (transformer) is integrated into the electronics since then the entire electronics placed in the transducer head can be sealed as a unit. This makes it possible to carry out repairs within 1 h.

An additional advantage of the invention consists in the fact that the electronics are constructed as a compact monobloc, the only connection to the outside of which only consists of the connections to passive components of the transducer head, typically of the connections to the curent transducer or tranducers, the connections to the transformer for power supply for the electronics and the connection to the optical waveguide.

Furthermore, an advantage is obtained in that, during disassembly of the electronics, no other functional blocks or parts thereof (primary conductor, current transducer, optical waveguide run, mounting on the insulator) must be removed to reach the electronics themselves.

A pot-shaped first shield housing of a magnetically shielding material having a coverplate parallel to the primary conductor ensures good magnetic shielding of the electronics against the magnetic fields emanating from the primary conductor.

Additional electromagnetic shielding is achieved by a second shield housing and running the lines in a particular manner.

The heat generated by the power electronics is removed over a large area to the surrounding air by means of a metal plate via the coverplate of the first shield housing so that the electronic components are well cooled and exhibit a longer life.

Heating effects of the transducer head by solar irradiation are kept low by arranging radiation reflectors inside the transducer head casing.

It is particularly advantageous to construct the surface of the radiation reflectors of polished aluminum as a result of which heat radiation is kept away from the electronics.

BRIEF DESCRIPTION OF THE DRAWING

In the text which follows, the invention is explained with the aid of an illustrative embodiment. The single FIGURE shows in partial section a current transducer arrangement for an outdoor high-voltage installation.

APPROACH TO CARRYING OUT THE INVENTION

A transducer head casing 1 of a stainless plate which exhibits a cover 4 which can be removed towards the top is attached to the upper end of a hollow high-voltage insulator 28. For better ventilation, the cover does not need to be mounted hermetically sealed. The high-voltage insulator 28 is mounted on a base 29 which is standing on level ground 30.

A current conductor or primary conductor 22 for a rated current of 3 kA and a rated alternating voltage of 400 kV is conducted through the transducer head casing 1 and surrounded inside the lower part of this transducer head casing by an annular primary or current transducer 25 and an annular current supply transformer 23.

The lower part of the transducer head casing 1 is separated by a partition 5 of corrosion-resistant plate from an upper part in which an electronics signal processing device or the electronics for the measurement signal of the current transducer are accommodated. The upper part of the transducer head casing 1 exhibits lower ventilation slots 2 closely above the partition 5 and upper venitlation slots 3 closely below the cover 4. The ventilation slots 2 and 3 are protected against direct rain by inclined areas projecting at the outside of the transducer head casing 1.

Above the partition 5, a pot-shaped electric shield casing 8 of 6 mm-thick aluminium plate is attached to the partition 5 by means of screws or supports 6. The shield casing 8 exhibits a cover or coverplate 10, which can be removed towards the top, in parallel with the primary conductor 22, into which coverplate a rubber seal 9 against spray water is inserted in the support area.

At the side walls of the shield casing 8 and at the coverplate 10, radiation reflectors 19, 18 and 17 of approximately 1 mm-thick aluminium plate, which is polished and degreased on both sides, are attached by means of screws or supports 20, 21 and 14. The distance of the radiation reflectors 17–19 from the side walls of the shield casing 8, from the coverplate 10 and from the inside walls of the transducer head casing 1 and its cover 4 is 3 cm. A ventilation slot remains in each case between the upper radiation reflectors 18 and 19.

Inside the electric shield casing 8, a pot-shaped magnetic shield casing 11 of soft iron is attached to the bottom of the shield casing 8 by means of screws or supports 7. The shield casing 11 exhibits a cover or coverplate 12, which can be removed towards the top, in parallel to the primary conductor 22, to which coverplate the electronics are attached. Low-power electronics 13, only symbolically indicated, is attached to the underside of the coverplate 12 and power electronics 16 indicated symbolically are attached above the coverplate. The power electronics 16 are in good thermally conducting contact with the coverplate 10 via a metal plate 15 so that the heat generated by the power electronics is rapidly removed to the surrounding air via this metal plate 15 and the coverplate 10.

From the power supply transformer 23 lead power supply lines 24, of which only one is shown for reasons of better clarity, and from current transducer 25 leads a measurement signal line 26 through an opening in the partition 5 and the bottom of the electric shield casing 8 in the intermediate space between the electric and magnetic shield casing 8 and 11 to the power electronics 16. The measurement signal line 26 and the power supply lines 24 are carried along a section of their path in a tube 31 which is connected to the partition 5 and which is sealed with respect to the bottom of the shield casing 8 by means of an insulating seal 32. From the space of the power electronics 16, a fibre-optical line line 27 leads along the same path through the opening in the partition 5 and then through the hollow inside space of the high-voltage insulator 28 and a hollow inside space in the base 29 at earth potential to a signal evaluation room not shown.

The lines 24, 26 and 27 are detachably attached to the power electronics 16. Lines, not shown, go from the power electronics 16 to the low-power electronics 13.

If a fault occurs in the electronics-power electronics 16 or low-power electronics 13-the covers 4 and 10 are successively removed towards the top with the high-voltage at the primary conductor 22 dis-connected. After that, the lines 24, 26 and 27 are detached from the power electronics 16 and the coverplate 12 with electronics attached is removed towards the top. The defective electronics are subsequently replaced by new calibrated electronics so that no further adjustment is necessary. After that, the coverplate 12 is inserted from the top and attached to the shield casing 11. The conductors 24, 26 and 27 are connected to the power electronics 16 and after that the two covers 10 and 4 are attached to the casing parts 8 and 1 in each case. In this manner, the repair can be carried out within 60 min, at the most, or within 30 mins by trained personnel.

The failure rate of the electronic components steeply increases with increasing temperature. Electronics installed in the open must be protected against environmental influences such as weather, birds, mice, insects and so forth which necessitates an encapsulation which is mechanically good and thus thermally poor. To take these influences into account and keep additional heating of the electronics due to solar irradiation as low as possible, the radiation reflectors 17–19 are provided with the highest possible reflection coefficients for heat radiation. In conjunction with the lower and upper ventilation slots 2 and 3, by means of which a chimney effect is achieved, they ensure that the temperature increase due to solar irradiation within the transducer head casing 1 is no more than about 1K. This increases the life of the electronic components and thus the operational readiness of the current transducer arrangement.

Instead of a radiation reflector 17 or 18 or 19 in the space between the electric shield casing 8 and transducer head casing 1, several radiation reflectors can also be provided which are spaced apart from each other. The distance between them and the distance between the outer radiation reflector and the transducer head casing 1 should not be less than 5 mm.

The outer surface of the transducer head casing 1 is preferably painted. The inner surface of the transducer head casing 1 is constructed to be metallically bare and degreased and thus to be a good reflector.

The alternating voltages of the primary conductor 22 are usually within a range from 50 kV to about 1 MV. Peak currents of up to 150 kA are permissible.

What is claimed is:

1. A current transducer arrangement for outdoor high-voltage installations, comprising
   (a) a primary conductor and a current transducer for detecting an alternating current flowing through the primary conductor;
   (b) at least one electronic signal processing device for the measurement signal of the current transducer;
   (c) a transducer head casing in which the current transducer and the electronic signal processing device are accommodated; and wherein
   (d) said electronic signal processing device is arranged above the current transducer and is attached to one of a cover and a coverplate of a first shield casing;
   (e) the first shield casing is enclosed by a second shield casing of a material having good electric conductivity;
   (f) the second shield casing includes one of a cover which can be removed towards the top and a coverplate;
   (g) an annular power supply transformer for supplying the electronic signal processing device with power is arranged inside the transducer head casing at the primary conductor; and
   (h) power supply lines coming from the power supply transformer and a measurement signal line coming from the current transducer are carried through the space between the first and second shield casing to the power section of the electronic signal processing device and are detachably connected to this power section.

2. Current transducer arrangement according to claim 1, wherein the electronic signal processing device is constructed as a block which can be removed from the top.

3. Current transducer arrangement according to claim 1, wherein:
   (a) the first shield casing includes a pot-shaped casing part of a magnetically shielding material and
   (b) the coverplate of the first shield casing is arranged in parallel to the primary conductor.

4. Current transducer arrangement according to claim 1, wherein:
   (a) the power section of the electronic signal processing device is arranged in the intermediate space between the first and second shield casing and
   (b) is in good thermally conducting contact with the coverplate of the second shield casing.

5. A current transducer arrangement for outdoor high-voltage installations, comprising
   (a) a primary conductor and a current transducer for detecting an alternating current flowing through the primary conductor;
   (b) at least one electronic signal processing device for the measurement signal of the current transducer; and
   (c) a transducer head casing in which the current transducer and the electronic signal processing device are accommodated and wherein
   (d) the electronic signal processing device is arranged above the current transducer;
   (e) the transducer head casing includes a partition between the primary conductor and the electronic signal processing device;
   (f) lower ventilation slots are arranged at least above and near this partition at the transducer head casing;
   (g) upper ventilation slots are arranged at least near the cover of the transducer head casing; and
   (h) at least one lateral radiation reflector is arranged between the electronic signal processing device and at least one side wall of the transducer head casing at a pre-determinable distance from this side wall.

6. Current transducer arrangement according to claim 5, wherein:
   (a) at least one upper radiation reflector is arranged between the electronic signal processing device and the cover of the transducer head casing at a predetermined distance from this cover; and
   (b) a ventilation slot remains between this upper radiation reflector and the at least one lateral radiation reflector.

7. Current transducer arrangement according to claim 6, wherein:
   (a) the reflection coefficient of each radiation reflector is greater than 0.8 at least on a surface facing the transducer head casing; and
   (b) the radiation reflectors include at least one surface of polished aluminum.

* * * * *